United States Patent
Hong

[11] Patent Number: 5,899,719
[45] Date of Patent: May 4, 1999

[54] SUB-MICRON MOSFET

[75] Inventor: Gary Hong, Hsin-Chu, Taiwan

[73] Assignee: United Semiconductor Corporation, Hsin-Chu, Taiwan

[21] Appl. No.: 08/888,714

[22] Filed: Jul. 7, 1997

Related U.S. Application Data

[60] Provisional application No. 60/037,203, Feb. 14, 1997.

[51] Int. Cl.⁶ .................................................. H01L 21/336
[52] U.S. Cl. ........................ 438/289; 438/270; 438/272; 438/290; 438/291
[58] Field of Search .................................. 438/270, 283, 438/284, 272, 289, 290, 291

[56] References Cited

U.S. PATENT DOCUMENTS

| | | | |
|---|---|---|---|
| 4,471,522 | 9/1984 | Jambotkar | 438/289 |
| 5,364,807 | 11/1994 | Hwang | 437/44 |
| 5,571,738 | 11/1996 | Krivokapic | 437/44 |
| 5,688,700 | 11/1997 | Kao et al. | 438/289 |
| 5,750,430 | 5/1998 | Son | 438/291 |

*Primary Examiner*—Trung Dang
*Attorney, Agent, or Firm*—Rabin & Champagne, P.C.

[57] ABSTRACT

A narrow gate FET is formed on a substrate by providing a first layer of polysilicon on the active device regions of the substrate and doping the polysilicon by ion implantation. An etch/polish stop layer of silicon oxide and is deposited on the first layer of polysilicon. Openings are formed in the etch/polish stop layer and the first polysilicon layer to expose the surface of the substrate. An anneal is performed to diffuse N-type impurities from the first layer of polysilicon into the substrate. The heavily doped portions of LDD source/drain regions are formed partially within the substrate and partially within portions of the first layer of polysilicon left on the surface of the substrate. Next, a first implantation of N-type impurities is made across the opening in the first layer of polysilicon. A layer of silicon nitride is deposited over the first layer of polysilicon and within the openings in the first polysilicon layer. Etching is performed to provide nitride spacers on the sidewalls of the openings. A second implantation of P-type impurities is performed to counter-dope the channel and to laterally define the lightly doped portions of the source/drain regions. A gate oxide layer is formed on the substrate within the openings. A second layer of polysilicon is deposited on the device, onto the surface of the insulating spacer structures within the openings in the mask, and onto the gate oxide layer at the bottom of the openings. The second polysilicon layer is etched or polished in a process stopping on the etch/polish stop layer to form gate electrodes, with the gate electrodes extending between the spacers in the openings in the first polysilicon layer. The spacers are removed by wet etching and a third implantation of P-type impurities is made to form halo regions around the lightly doped portions of the source/drain regions.

25 Claims, 2 Drawing Sheets

SUB-MICRON MOSFET

This application claims priority from provision application Ser. No. 60/037,203, filed Feb. 14, 1997.

BACKGROUND OF THE INVENTION

1. Field of the Invention

This invention relates to reduced dimension MOS field effect transistors and to the formation of field effect transistors having narrow gate electrodes and reduced dimension source/drain structures.

2. Description of the Related Art

Field effect transistors, generally referred to as FETs or MOSFETs, are the most common devices in modern integrated circuit devices. One conventional configuration of a FET is illustrated in FIG. 1. Field isolation regions 12 are formed by the local oxidation of silicon (LOCOS) method at the surface of a substrate 10, defining the active device regions and providing lateral isolation between adjacent devices formed in and on the surface of the substrate 10. A gate oxide layer for the FET covers the active device regions of the substrate 10 and a gate electrode 16 of doped polysilicon is formed on the gate oxide layer 14. Oxide spacer structures 18 are generally provided on either side of the gate electrode 16. The inner edges of source/drain regions 20 define a channel region at the surface of the substrate, with a source/drain region extending from either side of the gate electrode 16 to the field isolation regions 12. Frequently, the source/drain regions 20 have a lightly doped drain (LDD) structure in which an inner, more lightly doped portion of the source/drain region is aligned with the edge of the gate electrode 16, and a more heavily doped portion of the source/drain region 20 is aligned with the oxide spacer structure 18. A P-pocket or halo implant 22 extends slightly below and toward the FET channel from each of the LDD source/drain regions. The P-pocket or halo implant reduces the short channel effects in the FIG. 1 FET.

Generally, the FET structure shown in FIG. 1 is prepared by first forming a field isolation mask on the surface of the substrate 10, with openings in the mask exposing the substrate over regions where the field isolation structures will be formed. The field isolation structures are then formed either using a local oxidation of silicon (LOCOS) process, as illustrated, or a shallow trench isolation method. The field isolation mask is then stripped and various implantations may be made into the active regions of substrate 10 to adjust the doping profile of the substrate within the active regions. A gate oxide layer 14 is then grown on the cleaned surfaces of the active regions of the substrate 10. Polysilicon is blanket deposited by a low pressure chemical vapor deposition (LPCVD) technique over the gate oxide layer and the field isolation regions. The polysilicon layer is doped, typically by ion implantation, and photolithography is used to define gate electrodes 16 over the active regions. The source/drain regions 20 are formed in a two-stage implantation process. A first ion implantation is made using the gate electrode and the field isolation regions to mask the substrate, forming the more lightly doped portions of the LDD source/drain regions 20. A layer of CVD oxide is then deposited over the gate electrodes and over the surface of the device. An etch back process forms spacer structures 18 from the CVD oxide layer on either side of the gate electrode 16. A second ion implantation is performed to form a more heavily doped region aligned to the oxide spacer structures 18 and completing the source/drain regions 20. In the illustrated NMOS device, the source/drain regions 20 may be doped with any N-type dopant or combinations of different N-type dopants might be used to achieve different diffusion profiles. Finally, the P-pocket region 22 is formed by angular ion implantation of boron ions with the implantation made so that the ion flux is at an angle of approximately 30° from normal (perpendicular) to the substrate.

Improvements in device density and reductions in the cost of manufacturing integrated circuits are closely linked to reducing the size of devices within the integrated circuits. The width of gate electrode 16, as well as the sizes of other device structures, are determined by conventional lithography processes. Shrinking the size of the FET shown in FIG. 1 generally cannot proceed beyond the resolution and alignment limitations of the particular process technology used in forming the FIG. 1 device. Thus, the width of the gate electrode 16 is typically designed to be a width d equal to the design rule for the particular process used in making the gate electrode. Further reductions in the size of the gate electrode are desirable to decrease device size and to improve the density of the integrated circuit. Adoption of higher resolution lithography techniques, which could facilitate forming smaller gate electrodes, is very expensive, and may only be economically justified for very high volume manufacturing. Smaller volume manufacturing operations and specialty or low-profit margin circuits might not cost effectively implement such high cost processes. Thus, even with the introduction of higher resolution lithography techniques, it may be difficult to further reduce the size of the FIG. 1 FET.

Another disadvantage of the device illustrated in FIG. 1 and of the method of making the device is that the source/drain electrodes require a significant implantation to ensure that their resistance is sufficiently low to provide good device performance. The required high level of ion implantation causes a variety of problems. For example, the heavy ion implantation dosage renders the substrate amorphous where the source/drain regions are to be formed. Recrystallization of the substrate in the source/drain regions is then performed in an annealing process which can produce defects in the recrystallized material, or which can lead to excessive levels of diffusion from the source/drain regions. Excessive diffusion from the source/drain regions can make the channel region beneath the gate electrode 16 narrower than is desired, compromising device performance. A further disadvantage with the FIG. 1 structure is that the P-type halo implant 22 overlaps with a considerable portion of the source/drain region 20. This extended overlap is undesirable for a variety of reasons, including the size of the P/N junction formed between the halo implant 22 and the source/drain region 20, which impairs the FET's performance by reducing switching speeds.

SUMMARY OF THE PREFERRED EMBODIMENTS

It is therefore an object of the present invention to provide FET devices having narrower gate electrodes. It is another object of this invention to form source/drain regions, including halo implants, in a more controlled manner.

An aspect of the present invention provides a method of making a FET in which a mask is formed over a substrate, with the mask having an opening exposing the surface of the substrate. A layer of spacer material is provided over the mask and within the opening in the mask and then the layer of spacer material is etched to provide spacers along the walls of the mask opening. A gate insulator is formed on the substrate between the spacers and a gate electrode is formed between the spacers. The spacers are removed and impurities are implanted to form localized halo regions within the substrate adjacent edges of the gate electrode.

Another aspect of the present invention provides a method of making a FET by forming first layer of polysilicon over a substrate and etching an opening in the first layer of polysilicon. First impurities are implanted into the substrate through the opening in the first layer of polysilicon, a layer of spacer material is deposited over the first layer of polysilicon and over the first impurities in the substrate and spacers are forced along sidewalls of the opening. Second impurities are implanted into the substrate between the spacers. A layer of gate dielectric is provided on the substrate at least between the spacers. A second layer of polysilicon is deposited over the first layer of polysilicon, over the spacers and on the gate dielectric, and then patterned to define a gate electrode from the second layer of polysilicon.

In a more detailed embodiment of this aspect of the invention, the first impurities under the spacers form a pair of first portions of source/drain regions within the substrate aligned with opposite edges of the gate electrode. This may be caused by the second impurities defining the lateral extent of the first portions.

In another more detailed embodiment, the method of forming a FET continues by implanting impurities into the first layer of polysilicon and annealing the first layer of polysilicon to cause impurities to diffuse into the substrate. This process may be used to form outer portions of source/drain regions at least partially in the substrate. In a still more particular aspect of the invention, the outer portions of the source/drain regions are formed at least partially in portions of the first layer of polysilicon which are left on the substrate in the completed FET.

DETAILED DESCRIPTION OF THE PREFERRED EMBODIMENTS

Figure 1:
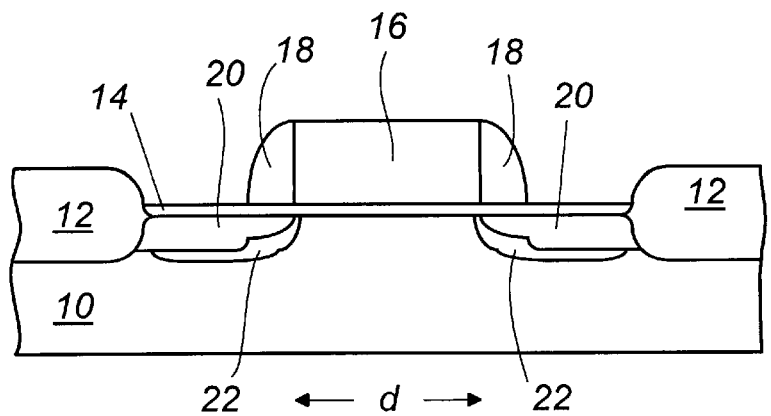
FIG. 1 illustrates a conventional MOSFET structure.

An aspect of the present invention provides a FET having a gate width and channel length that is shorter than the normal lithography resolution limit or design rule characteristic of the particular process used for making the FET. This may be accomplished on a substrate having active device regions defined between device isolation structures on the surface of the substrate by providing a first layer of polysilicon on the surface of one of the active device regions. An opening is formed in the first layer of polysilicon and then a layer of a material different from polysilicon is deposited over the first layer of polysilicon and within the opening in the first layer of polysilicon. Preferably the layer deposited over the first layer of polysilicon and within the opening is a layer of insulating material. The preferred layer of insulating material is then etched back to form spacers on the sidewalls of the opening in the first layer of polysilicon. A gate oxide layer is formed on the substrate between the spacers and then a second layer of polysilicon is deposited over the remaining portions of the first layer of polysilicon, over the spacers and on the gate oxide layer. Portions of the second layer of polysilicon are then removed to laterally define the gate electrode for the FET. This method allows for gate electrodes to be formed that are narrower than the design rule characteristic of a particular lithography process by two times the width of the spacers formed within the opening in the first polysilicon layer. Since the width of the spacers is essentially determined by the thickness of the insulating layer from which the spacers are formed, the width of the gate electrode is easily controllable in accordance with the present invention.

In a preferred embodiment of the invention, the first layer of polysilicon is doped with first conductivity type impurities and at least a portion of the source and drain regions for the FET are formed by diffusing impurities from the first layer of polysilicon into the substrate. It is possible in this method to form at least a portion of the source/drain regions partially within the substrate and partially within the portions of the first layer of polysilicon that are left in place on the substrate. This aspect of the present invention provides reliable source/drain regions that have a desirable level of conductivity, but which are made in a process that introduces far less damage into the substrate than in the conventional methods which include high dosage ion implantation steps. In addition, the portions of the first layer of polysilicon attached to the source/drain regions can then be used for forming local interconnects, further improving device integration.

In a further embodiment, the source/drain regions of this narrow gate FET can have an LDD structure in which the more highly doped portion of the LDD source/drain structure is formed within the substrate by diffusion from the first layer of polysilicon, with the more highly doped portion of the LDD source/drain also within the first layer of polysilicon. The more lightly doped portion of the LDD source/drain regions are formed by implanting first impurities of a first conductivity type across the entire opening in the first layer of polysilicon prior to forming the spacers on the sidewalls of the opening. A second implantation is performed after the spacers are formed to laterally define the more lightly doped portions of the source/drain regions and to counterdope the channel of the FET. Preferably, this second implantation provides a level of dopants appropriate to establishing the desired threshold voltage for the FET.

According to another embodiment of this aspect of the invention, a pocket or halo implantation can be formed adjacent the edge of the gate electrode. After the gate electrode is defined, the spacers can be removed and impurities of the second conductivity type implanted through the openings formed by removing the spacers to form a highly localized pocket or halo region doped with impurities having a conductivity type opposite to that of the source/drain region. The pocket or halo implant formed in this manner is highly localized, reducing the size of the P/N junction that is formed between the source/drain region and the pocket or halo implant. Reducing the size of this P/N junction can increase the operating speed of the FET.

In a more detailed aspect of the present invention, the lateral extent of the gate electrode of the narrow gate FET can be defined by a simple polishing or etch back process. According to this variation, the first layer of polysilicon is deposited over the surface of the active device region and then a layer of an etch stop or polish stop material is provided over the surface of the first layer of polysilicon. Most preferably, the etch stop layer or polish stop layer is an insulator such as silicon oxide. An opening is provided in the etch/polish stop layer and the first layer of polysilicon. A layer of spacer material is deposited over the etch/polish stop layer and within the opening in the first layer of polysilicon and then spacers are formed on the sidewalls of the opening in an etch back process that preferably does not etch the etch/polish stop layer. A gate oxide layer is formed on the substrate between the spacers. The second layer of polysilicon is deposited on the etch/polish stop layer, over the spacers and on the gate oxide layer. The gate electrode is defined in an etching or polishing process that removes raised portions of the second layer of polysilicon and that stops on the surface of the etch/polish stop layer. For example, chemical mechanical polishing (CMP) might be used to remove the portions of the second layer of polysilicon that extend over the surface of the remaining portions of the first layer of polysilicon, thereby defining a gate electrode from the second layer of polysilicon that lies fully within the opening in the first polysilicon layer.

Figure 2:
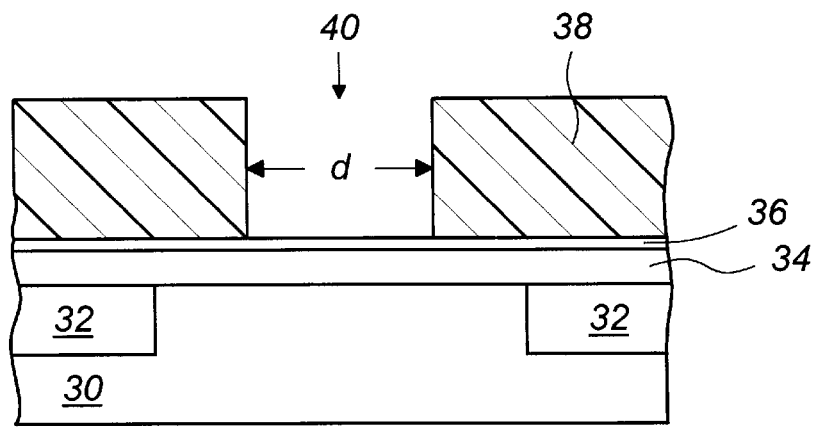
FIGS. 2–6 illustrate steps in the manufacture of a MOSFET in accordance with preferred embodiments of the present invention.
Figure 5:
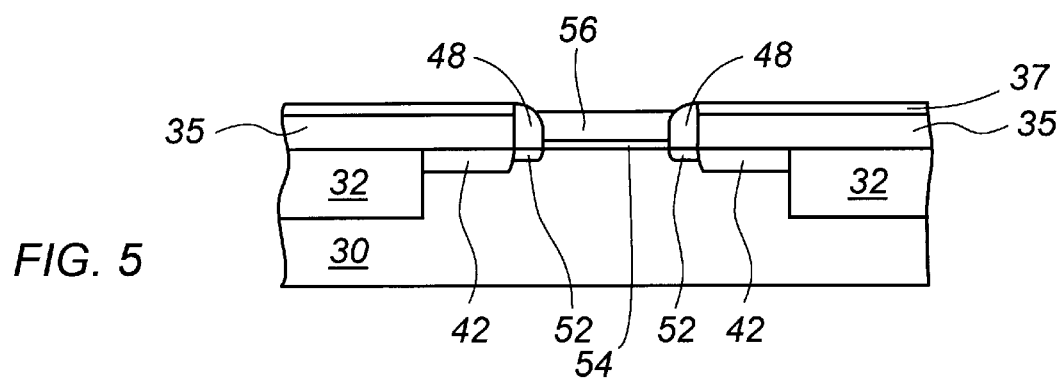
Figure 6:
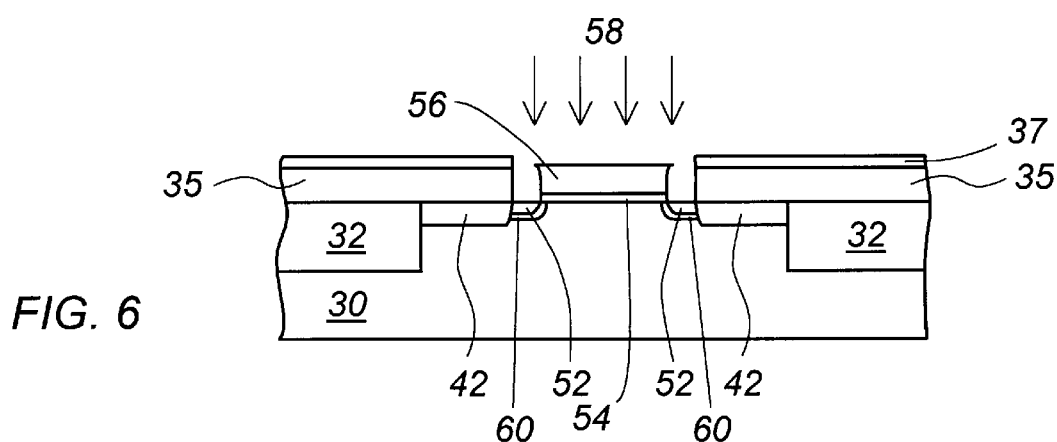

A particularly preferred embodiment of the present invention, a FET having a gate electrode narrower than the design rule, is shown in FIG. 6. Very briefly, the FIG. 6 device can be formed by depositing a first layer of polysilicon 34 on a substrate 30 and doping the first layer of polysilicon by ion implantation (FIG. 2). A layer of silicon oxide 36 is provided on the first layer of polysilicon 34 that can be used as an etch/polish stop layer. The etch/polish stop layer 36 and the first layer of polysilicon 34 are patterned to provide an opening which exposes an active region of the substrate. The width of the opening 41 (FIG. 3) in the patterned first layer of polysilicon 35 may be designed to be equal to the design rule for the process being used. Preferably, an annealing step is performed to diffuse impurities from the first polysilicon layer into the substrate to partially form the more highly doped portions 42 of LDD source/drain regions. According to a preferred aspect of the present invention, the more highly doped portions of the source/drain regions are formed partially within portions of the substrate and partially within the first layer of polysilicon left on the substrate. A first implantation of dopants 44 (FIG. 3) of a first conductivity type is performed through the opening in the first layer of polysilicon at a doping level appropriate to the formation of the lightly doped portion of the LDD source/drain regions. A layer of insulating material is deposited over the etch/polish stop layer 37 and on the exposed portion of the substrate within the opening 41 in the first polysilicon layer. An etch back process is performed on the layer of insulating material to define spacer structures 48 (FIG. 4) on the substrate alongside either side of the opening in the first layer of polysilicon. A second implantation 50 is performed into the substrate exposed between the spacers, implanting impurities of a second conductivity type to laterally define the extent of the lightly doped portion of LDD source/drain regions 52 and to adjust the conductivity of the channel region of the FET to be formed. A gate oxide layer 54 (FIG. 5) is provided at the base of the narrowed opening in the first layer of polysilicon 35 to cover the substrate between the spacer structures 48. A second layer of polysilicon is deposited over the remaining portions of the first layer of polysilicon 35, over the surfaces of the spacer structures 48 within the opening in the first layer of polysilicon, and onto the gate oxide layer 54 at the bottom of the opening. Portions of the second layer of polysilicon are removed by chemical mechanical polishing or an etch back process to form polysilicon gate electrode 56 bounded laterally by the spacers within the opening in the first layer of polysilicon.

If it is desirable to reduce the short channel effect in the illustrated FET, then a pocket or halo region 60 having a dopant of the conductivity type opposite to that of the lightly doped portion 52 of the source/drain region can be provided. Typically, the CMP or etch back process used to form the gate electrode 56 will cause the upper surface of the gate electrode to be lower than a portion of the adjacent spacer structures 48 so that the surface of the spacers 48 will be exposed. The spacers 48 are removed from between the remaining portions of the first layer of polysilicon 35 and the gate electrode 56 by a wet etching process. An implantation 58 is then provided through the openings left upon removal of the spacers to form the halo regions 60. The halo implantation can be activated through a rapid thermal process performed at this time, or the implant can be activated as part of another, subsequent thermal processing step. Further processing, including deposition of an insulator to refill the spacer openings, is performed in the usual manner.

This overview of particularly preferred embodiments of the present invention has illustrated certain advantageous aspects of the present invention. A more detailed discussion of these embodiments and related embodiments is now presented with particular reference to FIGS. 2–6. While the following discussion emphasizes an NMOS FET, a PMOS device could be formed in essentially the same manner by reversing the conductivity type of the various doped regions in the device.

Referring first to FIG. 2, formation of the narrow gate FET begins on a silicon substrate 30 by forming field isolation regions 32 on the surface of the substrate. The field isolation structures may be conventional LOCOS oxide structures, or may be shallow trench isolation structures. The shallow trench isolation structures may be formed by first providing a pad oxide layer over the surface of the substrate and then providing a silicon nitride masking layer over the pad oxide. A photoresist mask is formed by conventional photolithography and then the nitride and oxide layers are etched to expose the surface of the substrate over the regions where the device isolation structures are to be formed. The photoresist mask is removed to leave the silicon nitride layer as a hard mask. Trenches are etched into the substrate using reactive ion etching (RIE) with HCl and HBr as source gases. The trenches are filled with oxide by first thermally oxidizing the inner surface of the trench and then the rest of the trench is filled by plasma enhanced chemical vapor deposition (PECVD) from a TEOS source gas. The device isolation mask is then removed, leaving the device isolation regions 32 on the surface of the substrate 30.

A layer 34 of polysilicon is blanket deposited over the device, covering the isolation structures 32 and preferably in contact with the surface of the substrate within the active regions. The polysilicon layer 34 may be deposited to a thickness of between 2000–4000 Å using typical low pressure chemical vapor deposition (LPCVD) polysilicon deposition conditions. The polysilicon layer 34 is doped by implantation of phosphorus ions at an energy of 20–50 KeV or arsenic ions at an energy of 30–80 KeV, with either dopant implanted to a dosage of $1\times10^{15}$–$2\times10^{16}$/cm$^2$. Most preferably, the implantation energy is sufficiently low that the implanted ions remain within the polysilicon layer 34 and do not reach the surface of the substrate. Implantation of the first layer of polysilicon 34 is preferred because implantation allows more precise control of the dopants and allows dopants to be kept away from what will be the channel of the FET. The quantity of dopant provided to the polysilicon layer 34 is such that subsequent annealing of the polysilicon layer 34 will cause sufficient impurities to diffuse from the polysilicon layer 34 into the substrate 30 to form the more heavily doped portions of the source/drain regions for the narrow gate FET. Preferably, in the finished structure, the source/drain regions will lie partially in the polysilicon layer 34 and partially within the substrate 30. Because the portions of the source/drain regions within the substrate are formed by diffusion, they will typically be shallower than source/ drain regions formed within the substrate solely by ion implantation, like those illustrated in FIG. 1. Preferably, the activating anneal for the impurities implanted into the first layer of polysilicon is made at a later processing stage.

In particularly preferred embodiments, a layer of an etch stop or polish stop material 36 different from polysilicon is provided over the surface of the first layer of polysilicon 34. This etch/polish stop material is primarily to be used in the etch back or CMP process that defines the extent of the gate electrode. It is, of course, possible to perform either an etch back or a CMP operation without providing an etch/polish stop layer 36 or to use other etching processes in defining the gate electrode, but these alternatives are presently believed to be less desirable. The etch/polish stop layer 36 is preferably a relatively hard insulating material, such as silicon oxide or silicon nitride. It is particularly preferred that the etch/polish stop layer 34 be different from the material used to form the spacers. To facilitate the use of wet etching to remove the spacers in the preferred method of forming a localized halo implant for the illustrated FET, it is preferred that the spacers be different from the oxide used as the gate dielectric layer. Accordingly, it is preferred that the spacers be formed from silicon nitride and the etch/polish stop layer 36 be silicon oxide. The oxide etch/polish stop layer 36 might be between about 200–2000 Å in thickness, and may be formed either before or after the first polysilicon layer is doped by ion implantation. If the oxide layer 36 is provided before ion implantation, then the oxide layer can be formed by any conventional method and the implantation of dopants into the polysilicon is performed at energies that ensure that the dopants reach the appropriate position within the first layer of polysilicon. In such a case, the oxide layer 36 might be formed by thermal oxidation of the polysilicon at a temperature of between 800°–1000° C. in an oxidizing environment. If, on the other hand, the oxide layer is provided after the polysilicon layer is doped, then the oxide layer should be deposited in a low temperature CVD process at a substrate temperature of approximately 300°–400° C.

Figure 3:
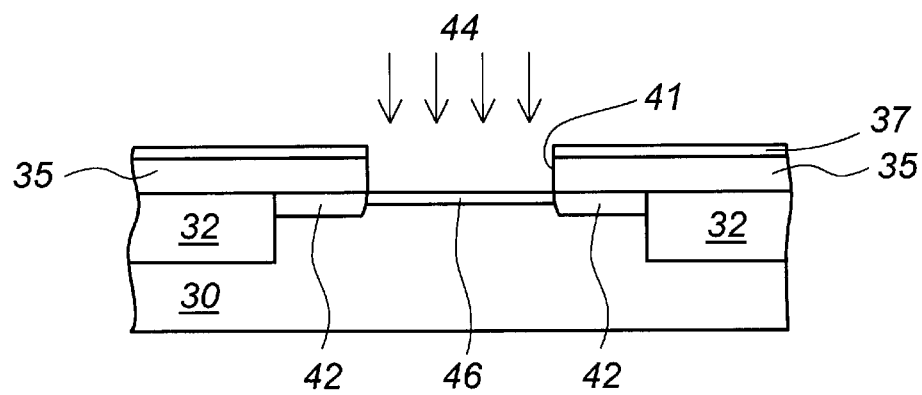

A mask 38 is then formed on the oxide or other etch/polish stop layer 36 having openings which expose the oxide layer 36 over regions that will be etched away to form openings in first polysilicon layer 34. The illustrated mask 38 may be formed from photoresist by conventional photolithography techniques or may be a hard mask, depending on the particular lithography and etch processes to be used. The openings in the mask 38 preferably have a width d equal to the design rule for the particular process being used. Subsequent processing will result in the formation of a gate electrode having an effective length smaller than the length d dictated by the design rule of the conventional process. Silicon oxide layer 36 is etched using, for example, an RIE process using a fluorine-bearing source gas such as $CF_4$, patterning the oxide layer and leaving remaining portions of the oxide etch/polish stop layer 37. Anisotropic etching of the doped polysilicon layer 34 is then performed through the openings 40 in mask 38 using, for example, a plasma etchant derived from HCl and HBr gases to form an opening 41 between the remaining portions 35 of the first polysilicon layer (FIG. 3). The photoresist mask 38 is then removed by ashing, if it has not been removed earlier.

After the opening 41 has been defined in the first polysilicon layer 35 and the etch/polish stop mask 37, it is preferred that the partially completed device be annealed to cause impurities to diffuse from the remaining portions of the polysilicon layer 35 into the substrate to form the more heavily doped portions 46 of source/drain regions for the FET that lie within the substrate. This annealing step might consist, for example, of heating the FET to a relatively low temperature of approximately 800° for approximately ten minutes or of heating the FET in a rapid thermal process at a temperature of 900°–1000° C. for a time period of about ten to a few tens of seconds. Annealing the FIG. 3 device drives in the earlier implantation to the first polysilicon layer and diffuses impurities from the first polysilicon layer 35 into the relatively shallow, comparatively heavily doped regions 42. It is preferred that this anneal be performed prior to the subsequent implantation or doping steps, because this annealing step is preferably continued for a longer time, as compared to the duration of anneal necessary to activate the subsequent implantations. If this drive-in anneal were performed after the subsequent implantations, the anneal might cause the subsequently implanted impurities to diffuse in an undesirable manner. Next, an implantation 44 is made to the substrate surface 46 where it is exposed within opening 41 with the implantation 44 made using N-type dopants to provide a doping level appropriate to the lightly doped portions of the LDD source/drain regions. For example, either arsenic or phosphorus ions might be implanted at an energy of between about 20–50 KeV to a dosage of about $1 \times 10^{13}$–$8 \times 10^{13}/cm^2$. The side portions of the implanted surface region 46 that are later covered by the spacers will become the more lightly doped portions of the LDD source/drain regions. Most preferably, the appropriate activating anneal for region 46 is deferred until a later stage in the process.

A layer of spacer material, preferably a layer of insulating material, is then deposited over the device. As discussed above, it is preferred that the spacer material be silicon nitride to best facilitate the various additional processing steps to be performed in different preferred embodiments of the present invention. The spacer layer will be formed into spacer structures within the openings 41 in the polysilicon layer 35 by an etch back process. It is thus preferred that the spacer layer be selectively etched by an etchant that does not rapidly etch the silicon substrate and does not etch the etch/polish stop layer 37. If no etch/polish stop layer is used, then the spacer material should be selected so that it can be selectively etched by an etchant that does not rapidly etch polysilicon. The width of the spacer structures should be set to fix both the length of the gate electrode and the width of the more lightly doped portions of the source/drain regions for the narrow gate FETs. The spacer structures extend from the sidewalls of the openings 41 in the polysilicon layer 35 and so the width of the spacers determines the separation between the spacers and the length of the gate electrodes of the narrow gate FET. The lateral extent of the lightly doped portions of the source/drain regions is defined by counter doping the channel of the FET (FIG. 4), so that the width of the spacers also determines the length of the lightly doped portions of the source/drain regions. Because the spacer structures are formed by an etch back process, the width of the spacers will be essentially the same as the thickness of the deposited spacer layer. For present device dimensions, a suitable thickness of the spacer layer may be 1000–2000 Å, although it is to be expected that these dimensions might be different for is other device configurations. The spacer structures eventually formed will then have widths of between approximately 1000–2000 Å. By applying this strategy to existing 0.5 μm processes, it is possible to form gates that would otherwise require 0.25 μm processing. If, on the other hand, the illustrated FET is being processed by equipment and processes that accommodate an 0.25 μm design rule, then the nitride spacers can be formed to have a thickness of between about 200–500 Å to achieve a reduction on that design rule. Preferably, silicon nitride is deposited as the spacer layer by CVD.

The spacer layer is then etched back to form spacers 48 alongside the portion 35 of the first layer of polysilicon. When silicon nitride is used as the sidewall spacer material, the spacers may be formed using reactive ion etching (RIE) using source gases including $SF_6$, $Cl_2$ and HBr to generate the etchant. An appropriate etching environment might be the LAM Rainbow system, which provides adjustable selectivity between etching silicon nitride and etching silicon oxide on the basis of the gas mixture from which the RIE etchant is derived. Once the sidewall spacers 48 are formed, a second implantation 50 (FIG. 4) is performed into the substrate using the spacers 48 to define the extent of the implantation. This second implantation is preferably made with dopants of the opposite conductivity type to the dopants used to form the doped region 46 (FIG. 3). For example, the second implantation 50 might consist of a dosage of $1\times10^{13}$-$1\times10^{14}/cm^2$ of boron ions at an energy of 10–40 KeV or of boron fluoride ions at an energy of 40–100 KeV. This implantation of P-type impurities laterally defines the more lightly doped portions 52 of the LDD source/drain structures so that the N-type lightly doped portions 52 are aligned on either side with the overlying spacers 48. The second implantation 50 preferably also adjusts the threshold voltage of the narrow gate FET to its desired level. A deeper, anti-punchthrough implantation might be made at this time, but this implantation may be unnecessary in those embodiments of the invention which form a pocket or halo implanted region adjacent the lightly doped portions 52 of the source/drain regions.

Figure 4:
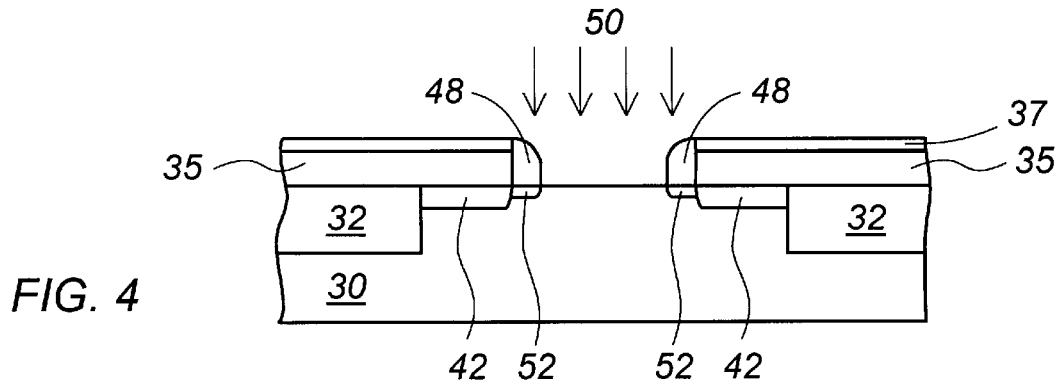

Next, the FIG. 4 device is placed in an oxidizing environment at a temperature of about 800° to grow a gate oxide layer 54 having a thickness of about 30–50 Å over the portion of the substrate 30 exposed between the insulating spacing structures 48. Forming the oxide layer at this time limits the extent of dopant segregation experienced by the narrow gate FET. A second layer of polysilicon, which will be formed into the narrow gate electrodes for the narrow gate FET, is blanket deposited by LPCVD over the device to a thickness of, for example, between 2000–5000 Å. The oxidation process will typically include sufficient heating of the substrate to activate the impurities within both the lightly doped portions 52 of the source/drain regions and the channel implantation 50 used to adjust the threshold voltage of the narrow gate FET. The second polysilicon layer is doped by arsenic implantation at an energy of 30–50 KeV to a dosage of $1\times10^{15}$-$2\times10^{16}/cm^2$. The device is then subjected to an etch back process, such as an RIE process using etchants derived from HCl and HBr, or a polishing process such as CMP to remove the portions of the second polysilicon layer that extend over the surface of the etch/polish stop layer 37. If an RIE process using chlorine and bromine derived etchants is used, the RIE process will generally not attack the preferred silicon oxide etch/polish stop layer 37. Alternately, a CMP process that etches polysilicon but which stops on silicon oxide can be used. The effect of the etching or polishing process is to remove the portions of the second layer of polysilicon that extend above the silicon oxide layer 37. This etching or polishing process also has the effect of laterally defining the gate electrode 56, as shown in FIG. 5. The lateral extent of the lower portion of the gate electrode 56 is defined by the sidewall spacer structures 48. The effective length of the gate electrode 56 is thus determined by the separation between the insulating spacer structures 48, which is less than the design rule d.

Further processing of the FIG. 5 device may be desirable to provide P-pocket or halo implanted regions adjacent and around the lightly doped portions 52 of the source/drain regions. For such embodiments, the silicon nitride spacers 48 are removed from the FIG. 5 structure by dipping the device in a heated phosphoric acid solution. Because the spacers 48 are exposed at their tops between the remaining portions of the first layer of polysilicon 35 and the gate electrode 56, this wet etch readily removes the silicon nitride spacers. In those embodiments where the gate oxide layer 54 is formed after the spacers 48, there will be no oxide layer on the substrate, which reduces the energy that must be provided to the dopants that form the halo region. An implantation 58 is then made into the substrate where it is exposed by the openings formed by removing the spacers. The halo implant might consist of a dosage of $1\times10^{13}$31 $5\times10^{13}/cm^2$ of boron dopant to diffuse, producing halo regions 60 that extend slightly beyond the causes the boron dopant to diffuse, producing halo regions 60 that extend slightly beyond the more slowly diffusing dopants that preferably form the lightly doped portions 52 of the source/drain regions. Processing continues to complete the FET structure, including the deposition of an insulator within the openings above the lightly doped portions of the source/drain regions.

Variations on the basic structure illustrated in FIGS. 2–6 may be desirable for some applications. For example, it may be desirable to use other, more conductive materials for the polysilicon wiring lines 35. Such a structure would reduce the resistance of connections formed through the wiring lines 35 to the source/drain regions 42. If higher levels of conductivity are desired for the wiring lines 35, multilayer conductors might be substituted for the single layer polysilicon wiring lines 35 in the step illustrated in FIG. 2. One appropriate multilayer conductor consists of a lower layer of doped polysilicon covered by a layer of a metal silicide such as titanium silicide or tungsten silicide. Preferably, these metal silicides are formed by physical deposition directly onto the surface of the lower polysilicon layer to avoid the high temperature annealing steps otherwise used in the formation of the metal silicides within polycide structures. Alternatively, the multilayer structure might consist of a lower layer of doped polysilicon coated with a layer of a refractory metal. In still another variation, the polysilicon layer could be replaced by a single layer of a refractory metal such as titanium. Use of a layer of titanium is compatible with the process described above because impurity atoms implanted into the titanium readily diffuse through the titanium, so that the titanium wiring lines can be used for doping the source/drain regions. For each of the variations described, the remainder of the processing would continue as described above, with the substitution of the appropriate etchants necessary to etch the multilayer structures. For most applications, however, the wiring line embodiments in which doped polysilicon is the sole conductor are preferred for their ease of manufacture, predictability and lower levels of interlayer stresses.

An advantage of the method described herein for forming FETs is that, as a consequence of the manufacture of the source/drain regions and the gate electrodes in the illustrated manner, local interconnect wiring lines 35 connected to the source/drain regions are naturally formed. This has many advantages for high density integrated circuit devices. For example, if the illustrated narrow gate FET were used within a static random access memory device, the wiring lines 35 could readily be adapted for forming the interconnections between the transistors and other devices within any of the standard cell configurations.

While the present invention has been described with particular emphasis on certain preferred embodiments thereof, the invention is not limited to these particular embodiments: Those of ordinary skill will appreciate that different implementations of this invention and alternated variations can be made, consistent with the teachings herein. Accordingly, the scope of the invention is to be determined by the claims which follow.

What is claimed:

1. A method of making a FET, comprising the steps of:

forming a mask over a substrate, the mask having an opening exposing the surface of the substrate, the mask opening having walls;

providing a layer of spacer material over the mask and within the opening in the mask;

etching the layer of spacer material to form spacers along the walls of the mask opening;

forming a gate insulator on the surface of the substrate between the spacers;

forming a gate electrode between the spacers in contact with the gate insulator; and removing the spacers and implanting impurities of a first conductivity type to form localized halo regions within the substrate adjacent edges of the gate electrode.

2. The method of claim 1, wherein the mask comprises conductive material doped with impurities of a second conductivity type.

3. The method of claim 1, further comprising the step of heating to diffuse impurities of a second conductivity type from the mask into the substrate to form at least parts of source/drain regions adjacent the walls of the mask opening.

4. The method of claim 1, further comprising the steps of:

implanting impurities of a second conductivity type through the opening in the mask before providing the layer of spacer material over the mask; and implanting impurities of the first conductivity type into the opening in the mask after the spacers are formed and before the gate electrode is formed, thereby forming a pair of first portions of source/drain regions within the substrate aligned with opposite edges of the gate electrode.

5. The method of claim 4, wherein the mask comprises polysilicon, the method further comprising the step of diffusing impurities from the mask into the substrate to form a pair of second portions of the source/drain regions in contact with the first portions of the source/drain regions, the second portions having a higher impurity concentration than the first portions.

6. The method of claim 4, further including an annealing step in which the impurities of the halo regions diffuse deeper into the substrate than the impurities of the first portions.

7. A method of making a FET, comprising the steps of:

forming a first layer of polysilicon over a substrate and etching an opening in the first layer of polysilicon;

implanting first impurities into the substrate through the opening in the first layer of polysilicon;

depositing a layer of spacer material over the first layer of polysilicon and over the first impurities in the substrate;

etching back the layer of spacer material to form spacers along sidewalls of the opening in the first layer of polysilicon;

implanting second impurities into the substrate between the spacers;

providing a layer of gate dielectric on the substrate at least between the spacers;

depositing a second layer of polysilicon over the first layer of polysilicon, over the spacers and on the gate dielectric; and defining a gate electrode from the second layer of polysilicon.

8. The method of claim 7, wherein the first impurities under the spacers form a pair of first portions of source/drain regions within the substrate aligned with opposite edges of the gate electrode.

9. The method of claim 8, wherein the second impurities define the lateral extent of the first portions.

10. The method of claim 7, further comprising the step of providing an etch/polish stop layer over the first layer of polysilicon, wherein the step of defining the gate electrode comprises removing portions of the second layer of polysilicon to expose the etch/polish stop layer over the first layer of polysilicon.

11. The method of claim 10, wherein the step of defining the gate electrode comprises removing the second layer of polysilicon in a process that stops on the etch/polish stop layer.

12. The method of claim 11, wherein the etch/polish stop layer is formed on the first layer of polysilicon before the step of etching an opening in the first layer of polysilicon.

13. The method of claim 12, wherein the etch/polish stop layer is silicon oxide.

14. The method of claim 13, wherein the spacers material is silicon nitride.

15. The method of claim 13, further comprising the step of implanting impurities into the first layer of polysilicon.

16. The method of claim 15, wherein the etch/polish stop layer is deposited on the first layer of polysilicon at a temperature below 400° C. after the step of implanting impurities into the first layer of polysilicon.

17. The method of claim 7, further comprising the steps of implanting impurities into the first layer of polysilicon and annealing the first layer of polysilicon to cause impurities to diffuse into the substrate.

18. The method of claim 15, wherein outer portions of the source/drain regions are formed at least partially in the substrate in the step of annealing the first layer of polysilicon.

19. The method of claim 18, wherein inner portions of the source/drain regions are defined by the step of implanting second impurities.

20. The method of claim 18, wherein the outer portions of the source/drain regions are formed at least partially in portions of the first layer of polysilicon which are left on the substrate in the completed FET.

21. The method of claim 19, further comprising the steps of removing the spacers after the step of forming the gate electrode to leave spacer openings adjacent the gate electrode.

22. The method of claim 21, further comprising the step of implanting third impurities of a conductivity type opposite to a conductivity type of the first impurities through the spacer openings.

23. The method of claim 22, wherein the step of implanting third impurities forms halo implanted regions adjacent the inner portions of the source/drain regions.

24. The method of claim 23, wherein the step of removing the spacers includes a wet etch.

25. The method of claim 24, wherein the spacers comprise silicon nitride and the wet etch is performed with a solution including phosphoric acid.

* * * * *